(12) United States Patent
Lim

(10) Patent No.: US 7,683,448 B2
(45) Date of Patent: Mar. 23, 2010

(54) CMOS IMAGE SENSOR

(75) Inventor: Keun Hyuk Lim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 142 days.

(21) Appl. No.: 11/612,627

(22) Filed: Dec. 19, 2006

(65) Prior Publication Data

US 2007/0152285 A1 Jul. 5, 2007

(30) Foreign Application Priority Data

Dec. 29, 2005 (KR) .................. 10-2005-0134068

(51) Int. Cl.
*H01L 29/78* (2006.01)
(52) U.S. Cl. .......... 257/431; 257/E31.11; 257/E31.111
(58) Field of Classification Search .................. 257/292
See application file for complete search history.

(56) References Cited

U.S. PATENT DOCUMENTS 7,075,125 B2 * 7/2006 Saito et al. .................. 257/194

7,180,151 B2 * 2/2007 Park ........................... 257/462
2005/0064621 A1 * 3/2005 Lim ........................... 438/57
2005/0184322 A1 8/2005 Inoue

FOREIGN PATENT DOCUMENTS

JP 2002-270810 9/2002

* cited by examiner

*Primary Examiner*—Zandra Smith
*Assistant Examiner*—Paul E Patton
(74) *Attorney, Agent, or Firm*—Saliwanchik, Lloyd & Saliwanchik

(57) ABSTRACT

A complementary metal oxide semiconductor (CMOS) image sensor is provided. The CMOS image sensor can include a photodiode, a transfer transistor (Tx), a reset transistor (Rx), a drive transistor (Dx), and a select transistor (Sx). The CMOS image sensor includes a floating diffusion region between the transfer transistor (Tx) and the reset transistor (Rx). The gate of the drive transistor (Dx) is formed of polysilicon and extends to and is formed on the floating diffusion region.

1 Claim, 3 Drawing Sheets

CMOS IMAGE SENSOR

RELATED APPLICATION(S)

This application claims priority under 35 U.S.C. §119(e) of Korean Patent Application No. 10-2005-0134068 filed Dec. 29, 2005, which is incorporated herein by reference in its entirety.

FIELD OF THE INVENTION

The present invention relates to a complementary metal oxide semiconductor (CMOS) image sensor, and more particularly, to a CMOS image sensor including four transistors.

BACKGROUND OF THE INVENTION

Generally, an image sensor is a semiconductor device that converts an optical image into an electrical signal. The image sensor may be classified as a charge coupled device (CCD) or a complementary metal oxide semiconductor (CMOS) image sensor.

The CMOS image sensor is fabricated using CMOS technology, and thus has low power consumption. Also, the CMOS image sensor is capable of being highly integrated and can be fabricated as a slim sized product.

Therefore, the CMOS image sensor has been widely used for various applications such as a digital still camera and a digital video camera.

Hereinafter, a related art CMOS image sensor will be described with reference to FIG. 1.

FIG. 1 is a plan view of a related art CMOS image sensor including four transistors.

The CMOS image sensor has a unit pixel incorporating a photodiode 12 for sensing light and four N-type MOS (NMOS) transistors.

The photodiode 12 is formed at one end of an active region 10. The four transistors constitute a transfer transistor Tx, a reset transistor Rx, a drive transistor Dx, and a select transistor Sx.

In FIG. 1, reference numerals 14, 16, 18 and 20 refer to gate patterns for the transfer transistor, reset transistor, drive transistor, and select transistor, respectively.

In operation, the photodiode 12 absorbs light to generate electrons.

When the transfer transistor Tx is turned on, the generated electrons move to a floating diffusion (FD) region 22.

The electrons moving to the FD region 22 generate an output signal through a source follower transistor (the drive transistor Dx).

In the related art CMOS image sensor, the FD region 22 is connected with the drive transistor Dx using a metal wiring 24.

Therefore, a metal contact hole 26 should be formed in the FD region 22 and on the gate electrode 18 of the drive transistor Dx.

However, the silicon substrate receives damage during an etch process for forming the metal contact hole 26.

In addition, in the related art CMOS image sensor, the FD region 22 is salicided prior to the forming of the metal wiring 24.

However, when the FD region 22 is salicided, leakage current may increase, and thus the electrons flowing in the FD region 22 may be lost or a dark current may be generated.

Accordingly, in the related art CMOS image sensor, the FD region 22 is connected with the drive transistor Dx through a non-salicide contact (i.e. not using a salicide contact).

However, such a non-salicide contact leads to an increase of contact resistance.

Also, since the non-salicided contact region has a higher etch rate than the salicide region, the silicon substrate may be etched during an etch process which may cause a leakage current.

BRIEF SUMMARY

Accordingly, embodiments of the present invention are directed to a complimentary metal oxide semiconductor (CMOS) image sensor that substantially obviates one or more problems due to limitations and/or disadvantages of the related art.

An object of embodiments of the present invention is to provide a CMOS image sensor where a non-salicide contact or a metal wiring are not used for connecting a floating diffusion region with a drive transistor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CMOS image sensor, including: a photodiode; a transfer transistor (Tx); a reset transistor (Rx); a drive transistor (Dx); and a select transistor (Sx).

A floating diffusion region may be formed between the transfer transistor (Tx) and the reset transistor (Rx).

A gate of the drive transistor (Dx) may be connected with the floating diffusion region using polysilicon.

An area of the polysilicon formed on the floating diffusion region may range from ½ to ⅕ of the area of the floating diffusion region.

As describe above, according to an embodiment of the present invention, problems that may occur in the design margin or processes can be prevented by connecting the floating diffusion region with the drive transistor (Dx) using the gate pattern of the drive transistor, without using a metal wiring.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings.

Figure 1:
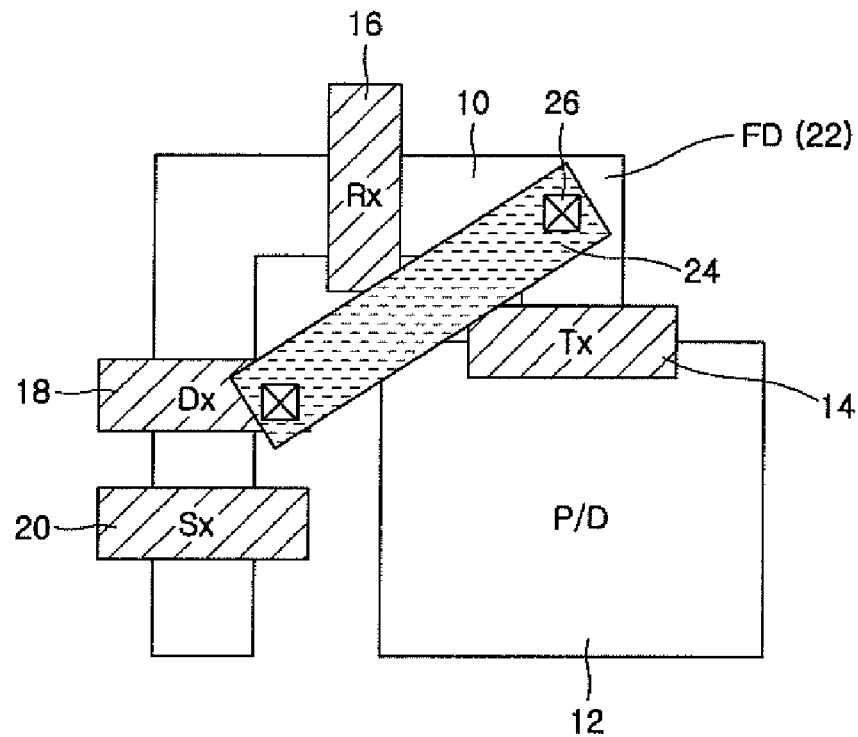
FIG. 1 is a plan view of a related art CMOS image sensor.
Figure 2:
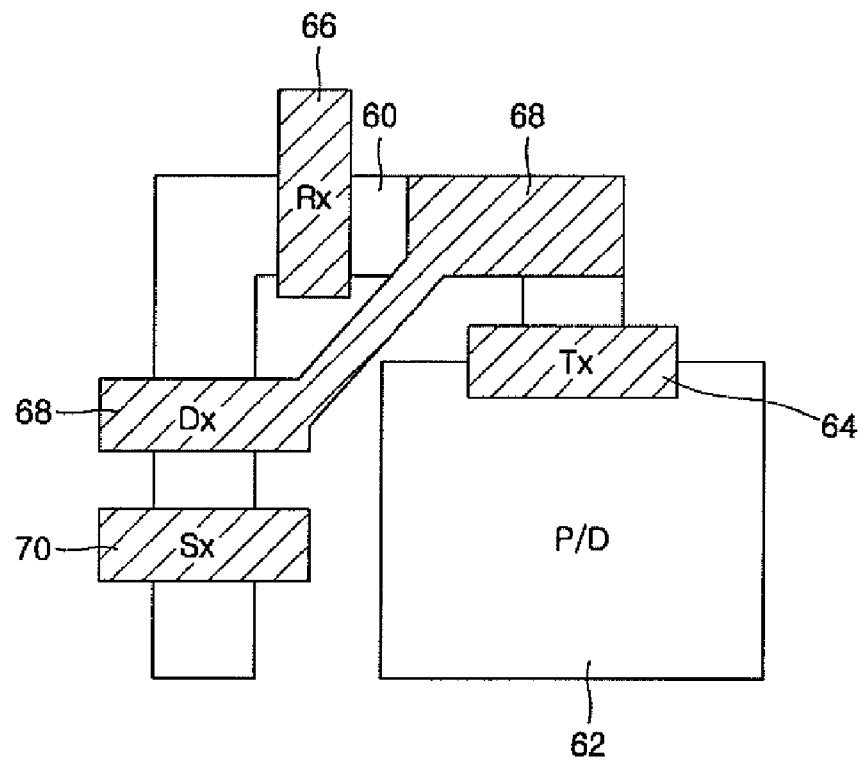
FIG. 2 is a plan view of a CMOS image sensor according to an embodiment of the present invention.

FIG. 2 is a plan view of a complimentary metal oxide semiconductor (CMOS) image sensor according to an embodiment of the present invention.

Referring to FIG. 2, a CMOS image sensor according to an embodiment of the present invention can have a unit pixel including a photodiode 62 for light sensing and four N-channel MOS (NMOS) transistors.

The photodiode 62 can be formed at one end of an active region 60. The four transistors can constitute a transfer transistor Tx, a reset transistor Rx, a drive transistor Dx, and a select transistor Sx.

In FIG. 2, reference numerals 64, 66, 68 and 70 refer to the gate patterns of the transfer transistor, reset transistor, drive transistor, and select transistor, respectively.

The basic operation of the CMOS image sensor is the same as that of the related art CMOS image sensor previously described.

That is, the photodiode 62 absorbs light to generate electrons, and when the transfer transistor Tx is turned on, the generated electrons move to a floating diffusion (FD) region.

Here, the FD region is formed in a portion of an active region that is located between the transfer transistor Tx and the reset transistor Rx.

The electrons moving to the FD region 68 generate an output signal through a source follower transistor (the drive transistor Dx).

In the CMOS image sensor according to an embodiment of the present invention, the FD region is connected to the drive transistor Dx using polysilicon instead of a metal wiring. In one embodiment, a coupling region between the polysilicon and the FD region can be increased in consideration of the resistance characteristic.

Since the metal wiring for connecting the FD region with the drive transistor Dx is not required, the design margin can be obtained. Also, since a metal contact hole is not formed in the FD region and on the drive transistor (Dx), a silicon substrate does not receive damage.

In addition, the CMOS image sensor according to embodiments of the present invention can prevent an increase in the contact resistance and an etching of the silicon substrate caused by non-salicidation of the FD region.

Figure 3:
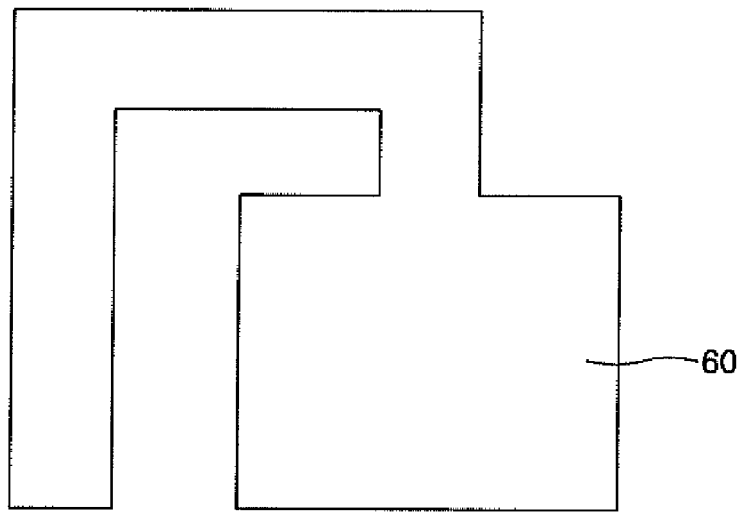
FIGS. 3 to 5 are plan views illustrating a method of fabricating a CMOS image sensor according to an embodiment of the present invention.
Figure 4:
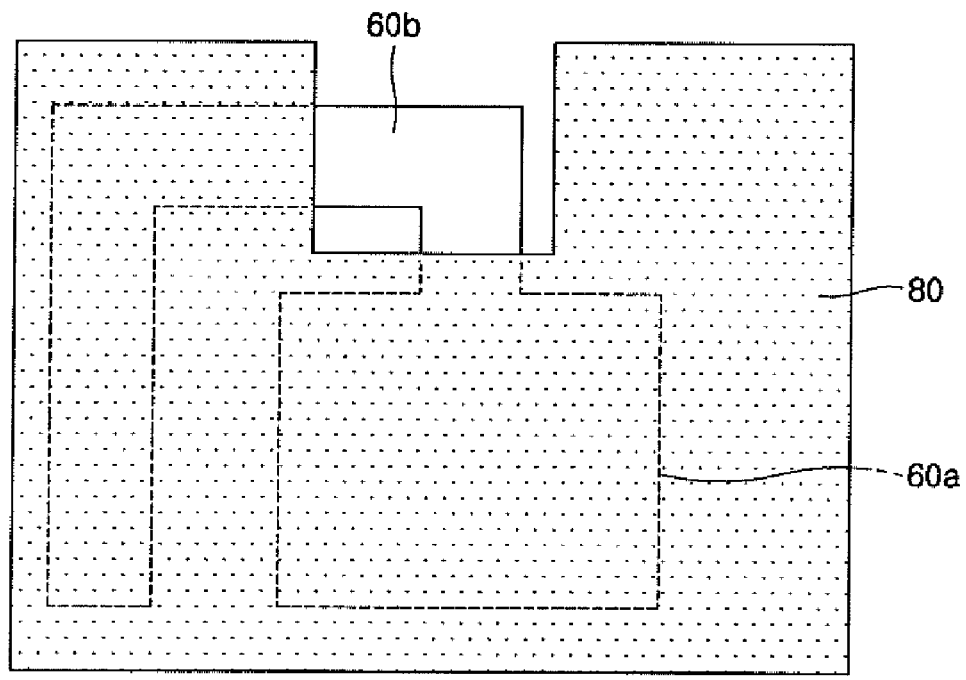
Figure 5:
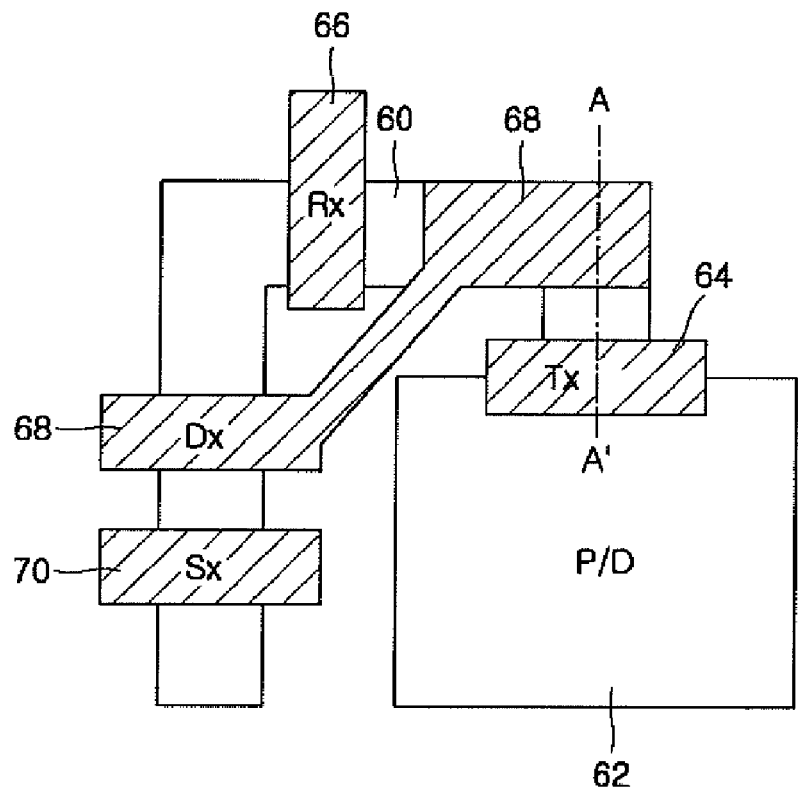
Figure 6:
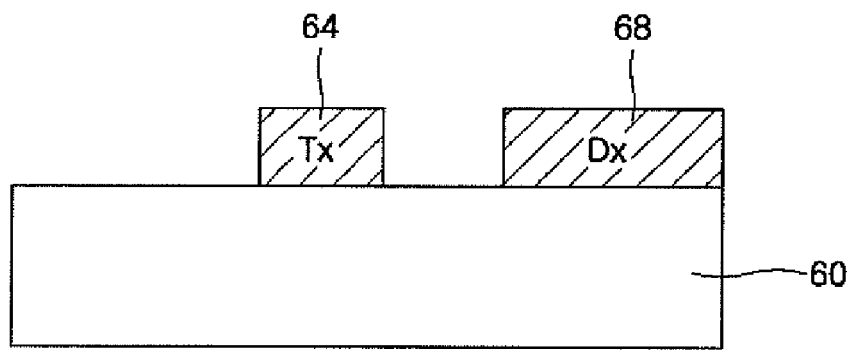
FIG. 6 is a cross-sectional view taken along a line A-A' of FIG. 5.

FIGS. 3 to 5 are plan views illustrating a method of fabricating a CMOS image sensor according to an embodiment of the present invention, and FIG. 6 is a cross-sectional view taken along line A-A' of FIG. 5. Like reference numerals refer to like elements in FIGS. 2 to 6.

Referring to FIG. 3, an active region 60 can be defined on a semiconductor substrate. Then, a gate oxide layer (not shown) can be formed on the active region 60.

Referring to FIG. 4, a mask pattern 80 can be formed on the substrate including the gate oxide layer to expose a FD region 60b of the active region 60. Next, the gate oxide layer on the FD region 60b can be etched.

That is, reference numeral 60b refers to the FD region 60b where the gate oxide layer is etched.

The FD region can be formed as an N+ region using an ion implantation process. Reference numeral 60a refers to a non-etched gate oxide layer on the active region.

Referring to FIG. 5, after removing the mask pattern 80, gate patterns 64, 66, 68 and 70 can be formed on the substrate, including on region 60a and on region 60b. The gate patterns 64, 66, 68 and 70 can be formed of polysilicon.

In particular, the gate pattern 68 of the drive transistor Dx extends towards and is formed on the FD region 60b.

Accordingly, as illustrated in FIG. 6, the gate pattern 64 of the transfer transistor Tx and the gate pattern 68 of the drive transistor Dx are formed on the active region 60.

Consequently, in the present invention, the gate pattern 68 of the drive transistor Dx can be connected with the FD region 60b using polysilicon.

That is, when the gate pattern 68 of the drive transistor Dx is formed using polysilicon, the polysilicon may be formed in a contact region of the FD region 60b.

Here, in order to lower the resistance value, the polysilicon may be formed in a predetermined area of the FD region 60b. The larger the area of polysilicon on the FD region, the lower the resistance may be.

The polysilicon formed on the FD region may be ½ or more of the area of the FD region 60b.

In one embodiment, the polysilicon formed on the FD region may be approximately ⅘ or less of the area of FD region 60b.

As described above, in a CMOS image sensor according to an embodiment of the present invention, a FD region can be connected with a drive transistor Dx using the gate pattern of the drive transistor, that is, a polysilicon pattern, not a metal wiring requiring contacts.

Therefore, since a metal wiring between the FD region and the drive transistor is not required, the design margin can be obtained.

Also, according to embodiments of the present invention, since a metal contact hole is not formed in the FD region and on the drive transistor Dx, the silicon substrate does not receive damage. In addition, the CMOS image sensor of the present invention can prevent an increase in the contact resistance and an etching of the silicon substrate caused by non-salicidation of the FD region.

It will be apparent to those skilled in the art that various modifications and variations can be made in the present invention. Thus, it is intended that the present invention covers the modifications and variations of this invention provided they come within the scope of the appended claims and their equivalents.

I claim:

1. A CMOS image sensor, comprising:
   a photodiode;
   a transfer transistor;
   a reset transistor;
   a drive transistor having a polysilicon gate; and
   a select transistor,
   wherein a floating diffusion region is formed between the transfer transistor and the reset transistor, and wherein a portion of the polysilicon gate of the drive transistor extends to and is formed on the floating diffusion region, and
   wherein an area of the polysilicon gate formed on the floating diffusion region ranges from ½ to ⅘ of an area of the floating diffusion region.

* * * * *